United States Patent
Fenghao et al.

(10) Patent No.: US 8,433,277 B2
(45) Date of Patent: *Apr. 30, 2013

(54) PASSIVE MIXER AND FOUR-PHASE CLOCKING METHOD AND APPARATUS

(75) Inventors: Mu Fenghao, Hjärup (SE); Tillman Fredrik, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1381 days.

This patent is subject to a terminal disclaimer.

(21) Appl. No.: 12/108,252

(22) Filed: Apr. 23, 2008

(65) Prior Publication Data

US 2009/0268849 A1    Oct. 29, 2009

(51) Int. Cl.
*H04B 1/26* (2006.01)
(52) U.S. Cl.
USPC .................. 455/324; 455/323; 455/171.1
(58) Field of Classification Search .......... 455/171.1, 455/318, 334, 73, 76, 118, 127.2, 114.3, 455/323–324
See application file for complete search history.

(56) References Cited

U.S. PATENT DOCUMENTS

| | | | |
|---|---|---|---|
| 5,974,306 A | 10/1999 | Hornak et al. | |
| 6,016,422 A | 1/2000 | Bartusiak | |
| 6,313,688 B1 | 11/2001 | Lee et al. | |
| 6,348,830 B1 | 2/2002 | Rebeiz et al. | |
| 6,510,185 B2 | 1/2003 | Lee et al. | |
| 6,847,808 B2 | 1/2005 | Zhou | |
| 6,972,610 B2 | 12/2005 | Behzad | |
| 6,999,747 B2 | 2/2006 | Su | |
| 7,031,688 B2 | 4/2006 | Malone et al. | |
| 7,085,548 B1 | 8/2006 | Kluge et al. | |
| 7,092,692 B2 | 8/2006 | Tan et al. | |
| 7,113,755 B2 | 9/2006 | Abdelli | |
| 7,145,963 B2 | 12/2006 | Magoon et al. | |
| 7,149,493 B2 | 12/2006 | Molnar et al. | |
| 7,277,682 B2 | 10/2007 | Zhou | |
| 8,072,255 B2 * | 12/2011 | Cicalini | 327/355 |
| 2004/0152437 A1 | 8/2004 | Behzad | |

(Continued)

FOREIGN PATENT DOCUMENTS

| | | |
|---|---|---|
| EP | 1 542 356 | 6/2005 |
| EP | 1 560 326 | 8/2005 |

(Continued)

OTHER PUBLICATIONS

Author Unknown. "Improving Receiver Intercept Point Using Selectivity." Maxim, May 17, 2001. Internet article available at: http://pdfserv.maxim-ic.com/en/an/AN749.pdf.

(Continued)

*Primary Examiner* — Christian Hannon
(74) *Attorney, Agent, or Firm* — Coats & Bennett, P.L.L.C.

(57) ABSTRACT

According to one embodiment, a radio frequency receiver comprises a quadrature mixer configured to convert radio frequency signals to baseband signals or intermediate frequency signals. The quadrature mixer comprises an in-phase passive mixer and a quadrature-phase passive mixer. Each passive mixer comprises a mixer core having a plurality of mixer input switch transistors and a plurality of output switch transistors connected to the mixer input switch transistors. Clock circuitry generates a plurality of quadrature pulsed clock signals and delayed versions of the quadrature pulsed clock signals. The quadrature pulsed clock signals and the delayed versions of the quadrature pulsed clock signals drive the mixer input switch transistors and the output switch transistors.

18 Claims, 9 Drawing Sheets

U.S. PATENT DOCUMENTS

| | | |
|---|---|---|
| 2004/0166803 A1 | 8/2004 | Moloudi et al. |
| 2005/0239430 A1 | 10/2005 | Shah |
| 2007/0054648 A1 | 3/2007 | Pullela et al. |
| 2007/0072575 A1* | 3/2007 | Sowlati et al. ............ 455/318 |
| 2007/0082640 A1 | 4/2007 | Kim |
| 2007/0171760 A1* | 7/2007 | Gomm et al. ............ 365/233 |
| 2007/0190959 A1 | 8/2007 | Kim et al. |
| 2007/0218855 A1 | 9/2007 | Ismail et al. |
| 2007/0224964 A1* | 9/2007 | Kwon et al. ............ 455/326 |
| 2007/0230558 A1 | 10/2007 | Sjoland et al. |
| 2007/0242779 A1 | 10/2007 | Choi et al. |
| 2008/0003973 A1 | 1/2008 | Vaisanen |
| 2008/0020728 A1 | 1/2008 | Zhuo et al. |
| 2008/0139149 A1 | 6/2008 | Mu et al. |
| 2008/0284487 A1 | 11/2008 | Pullela et al. |
| 2009/0270062 A1* | 10/2009 | Mu et al. ............ 455/323 |

FOREIGN PATENT DOCUMENTS

| | | |
|---|---|---|
| KR | 10-0666701 B1 | 1/2007 |
| WO | 03/071696 A1 | 8/2003 |
| WO | 2005/060089 A2 | 6/2005 |

OTHER PUBLICATIONS

Mu, F. et al. U.S. Appl. No. 12/108,239, filed Apr. 23, 2008 and entitled "Passive Mixer and Four-Phase Clocking Method and Apparatus."

* cited by examiner

PASSIVE MIXER AND FOUR-PHASE CLOCKING METHOD AND APPARATUS

TECHNICAL FIELD

The present invention generally relates to wireless communication systems, and more particularly relates to high linearity radio frequency (RF) receivers for RF communication systems.

BACKGROUND

Receiver mixers are a basic component in RF communication systems. Receiver mixers down-convert received RF signals into intermediate frequency (IF) signals or directly into zero intermediate frequency (ZIF) signals by multiplying the received signal with a local oscillator (LO) clock signal. ZIF, also known as homodyne or "direct conversion", is typically easier to implement in a receiver chip than IF conversion because ZIF eliminates pass-band filtering associated with IF conversion and reduces the space and complexity of the receiver as well as cost. A typical direct conversion receiver includes one or more LNAs (low noise amplifiers), a balun, in-phase (I) and quadrature-phase (Q) mixers and two low-pass filters.

Receiver mixers can be passive or active. An active mixer provides gain while converting an RF signal. However, active mixers cause higher distortion and have a higher noise figure. The higher noise figure arises from flicker noise which is not present in passive mixers. Flicker noise is very harmful for narrow band RF applications like GSM (Global System for Mobile communications). In addition, active mixers consume more power than their passive mixer counterparts.

RF communication systems usually implement duplex operation by way of a transceiver where the receiver and transmitter components function simultaneously. During transceiver operation, the transmitter typically sends signals at a high power level, injecting interference at the receiver. To counteract the interference, the receiver LNA and mixer typically have a very high linearity, especially for mixers where the RF signal is amplified after the LNA stage. For direct conversion receivers, mitigating transmitter-induced interference becomes even more important. Direct conversion receivers are typically designed to have good linearity. Especially the second order inter-modulation product is important. The second order inter-modulation product is often described by the second order input intercept point (IIP2).

IIP2 performance can be improved by using differential RF signals and a symmetric receiver topology to cancel nonlinearity caused by the transistors. A balun is conventionally used to perform single-ended to differential conversion. However, when differential RF signals are used and the receiver is configured in an RF current driving mode, a two-phase clock scheme is not feasible because the in-phase mixer loads the quadrature-phase mixer and vice versa, resulting in conversion gain drop and IQ leakage. One approach to solve this involves using a four-phase non-overlapping local oscillator clock scheme. A four-phase clock scheme also has higher conversion gain than 2-phase clocking schemes for capacitive mixer loads.

However, the duty cycle employed in sinusoidal four-phase clock schemes is typically narrow (e.g., less than 25%) to maintain non-overlapping sinusoidal I and Q clock input signals, making clock driver design difficult. When the receiving RF frequency increases, the clock signal duty cycle becomes narrower, making clock driver design even more difficult. Moreover, linearity for direct conversion passive mixers is related to the gate over-drive voltage applied to the mixer transistors. This in turn requires a large clock swing, especially for duplex communication systems where transmitter leakage interference is down-converted into the baseband signal. Increasing the bias voltage of the sinusoidal clock signals to achieve higher gate over-drive can cause overlapping clock signals, e.g. larger than 25% duty cycle, which adversely affects mixer functionality.

Also, conventional four-phase mixer architectures employ a clock driver chain having a relatively low tapering factor, meaning that more clock driver stages are required to drive the mixers and simultaneously maintain a desired duty cycle. Accordingly, the energy consumed in the clock driver cannot be recovered by a resonator tank circuit, resulting in higher power consumption. It is also difficult to align the edge of a positive clock signal with the edge of a negative clock signal, distorting down-converted baseband signals. Furthermore, it is difficult to keep the four-phase clock signals as non-overlapped because the duty cycle is small. The clock driver must be designed in a symmetric style to reach a high IIP2. Yet, process mismatch will always set an IIP2 limit. Transistor mismatch can be mitigated by increasing transistor size, but this increases power consumption in the clock driver.

SUMMARY

According to the methods and apparatus taught herein, a wireless transceiver comprises a radio frequency transmitter and receiver. The radio frequency receiver comprises a quadrature mixer configured to convert radio frequency signals to baseband signals or intermediate frequency signals. The quadrature mixer comprises an in-phase passive mixer and a quadrature-phase passive mixer. Each passive mixer comprises a mixer core having a plurality of mixer input switch transistors and a plurality of output switch transistors. The input switch transistors have a node connected to an RF input signal, and the output switch transistors have a node connected to an output of the mixer. Clock circuitry generates a plurality of quadrature pulsed clock signals and delayed versions of the quadrature pulsed clock signals rather than generating sinusoidal clock signals. The quadrature pulsed clock signals drive the mixer input switch transistors and the delayed versions of the quadrature pulsed clock signals drive the mixer output switch transistors, or in the reversed order.

A four-phase pulsed clock scheme is employed for controlling operation of the quadrature mixer. Conducting time slots of the mixer cores and sampling of the input RF signal are achieved using the pulsed clock signals and delayed versions of the pulsed clock signals. The pulsed clock signals and the delayed pulsed clock signals oscillate at a local oscillator clock frequency, enabling the quadrature mixer to frequency down-convert the input RF signal into IF or baseband signals.

Forming four-phase clock signals using the pulsed clock signals and the delayed pulsed clock signals at a local oscillator clock frequency relaxes the duty cycle constraints placed on the clock signals while improving mixer linearity and reducing receiver power consumption. Moreover, the voltage swing of the pulsed clock signals generates a larger gate over-drive voltage applied to the mixer transistors compared to conventional sinusoidal clock signals, further improving mixer linearity and performance.

In one embodiment, four quadrature pulsed clock signals and four delayed quadrature pulsed clock signals, all with 50% duty cycle, drive both the in-phase and the quadrature-phase mixers of the quadrature mixer. Alternatively, in another embodiment, four pairs of differential quadrature pulsed clock signals and their delayed versions, are used to drive the quadrature mixer. While this particular embodiment uses more pulsed clock signals, the pulsed clock signals can have a duty cycle other than 50%.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
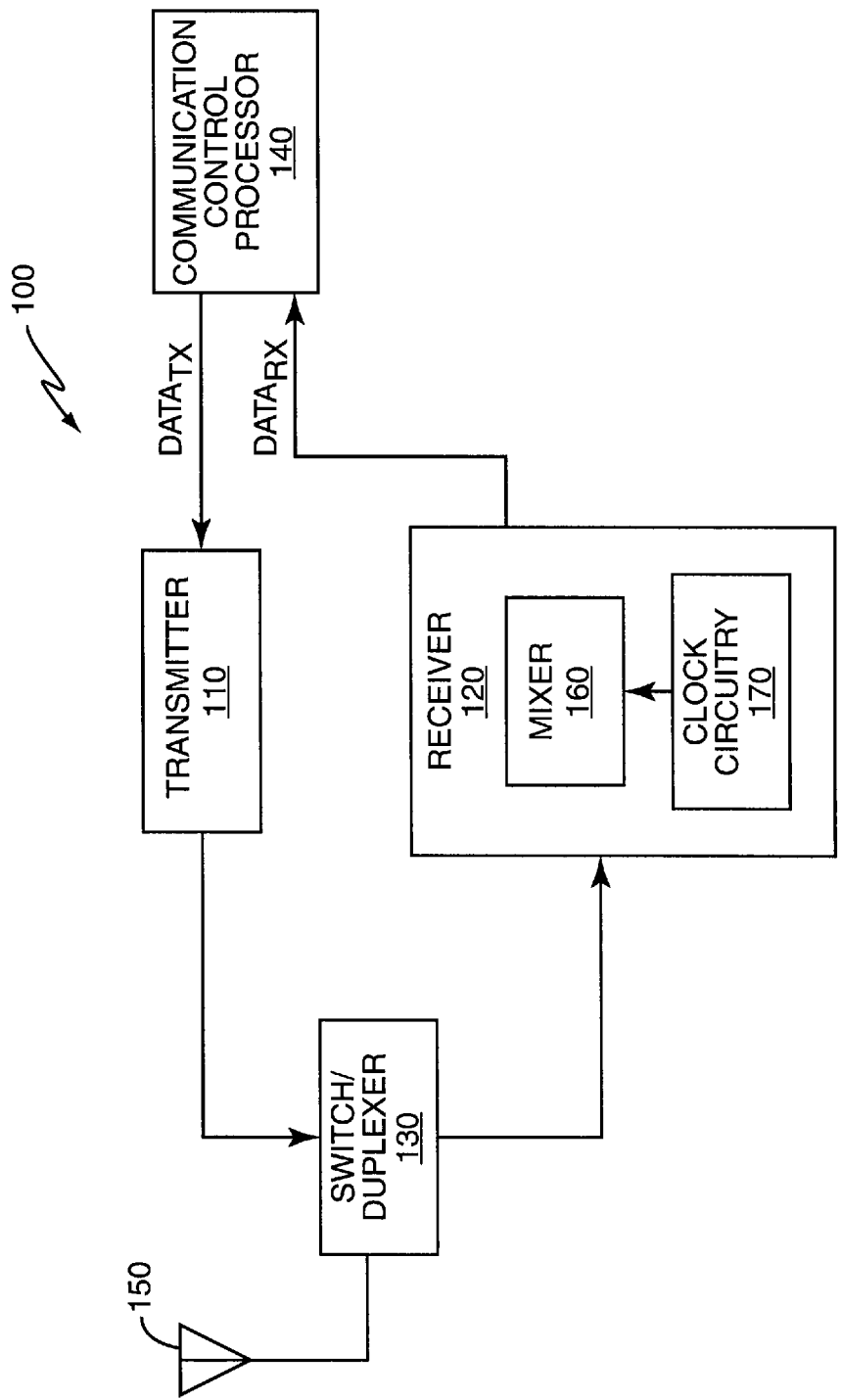
FIG. 1 is a block diagram of an embodiment of a transceiver including a transmitter and receiver having a quadrature mixer.

FIG. 1 illustrates an embodiment of a wireless transceiver 100 including a transmitter 110 and a receiver 120. A switch/duplexer 130 enables half duplex or full duplex operation. A communication control processor 140 manages operation of the transmitter 110 and receiver 120. Baseband signals to be transmitted ($DATA_{TX}$) are passed from the processor 140 to the transmitter 110. The transmitter 110 frequency up-converts the baseband signals to RF signals. The switch/duplexer 130 couples the transmitter 110 to one or more antennas 150 so that the RF signals can be transmitted over the air. RF signals are similarly received at the one or more antennas 150 and provided to the receiver 120 via the switch/duplexer 130. The receiver 120 frequency down-converts the RF signals to baseband signals ($DATA_{RX}$) and passes the baseband signals to the control processor 140 for further processing, e.g., demodulation, decoding, etc. The receiver 120 includes a passive quadrature mixer 160 (including an in-phase passive mixer and a quadrature-phase passive mixer) and clock circuitry 170. The passive quadrature mixer 160 is driven by the clock circuitry 170 and down-converts received RF signals into baseband signals.

Figure 2:
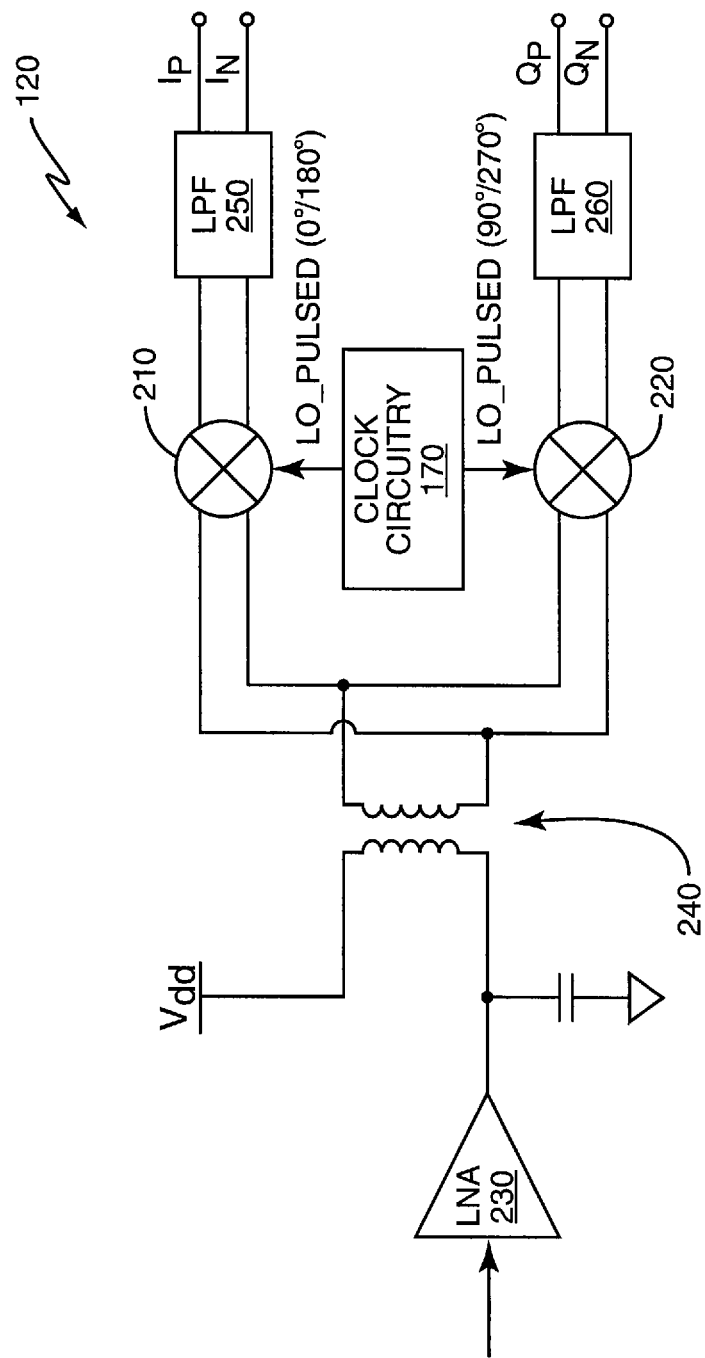
FIG. 2 is a block diagram of an embodiment of a quadrature mixer having an in-phase passive mixer and a quadrature-phase passive mixer.

FIG. 2 illustrates an embodiment of the receiver 120. According to this embodiment, the passive quadrature mixer 160 includes an in-phase passive mixer 210 and a quadrature-phase passive mixer 220. The passive mixers 210, 220 are driven by the clock circuitry 170 and frequency down-convert received RF signals to intermediate frequency or baseband in-phase and quadrature-phase signals. Each passive mixer 210, 220 includes a mixer core which can be a complementary passive mixer or an NMOS (n-type metal oxide semiconductor) or PMOS (p-type metal oxide semiconductor) passive mixer. An NMOS device will conduct at logic high where the voltage between gate and source is larger then the threshold voltage of the n-type of device, and a PMOS device will conduct at logic low where the voltage between gate and source is less then the threshold voltage of the device referring to its source.

During operation, a received RF signal is amplified by a Low Noise Amplifier (LNA) 230. The gain of LNA 230 can be varied. A balun 240 inductively couples the output of the LNA 230 to differential inputs of the in-phase and quadrature-phase passive mixers 210, 220, respectively, transforming the single-ended RF output of the LNA 230 to a differential RF signal. The balun 240 may have any ratio of primary to secondary windings. As such, the total voltage gain of the receiver 120 is the sum of the LNA and balun voltage gain. The in-phase and quadrature-phase passive mixers 210, 220 down covert the differential RF signal to low IF or baseband signals at the mixer outputs. The passive mixer outputs are then filtered by respective low pass filters 250, 260 to yield differential in-phase ($I_P/I_N$) and quadrature-phase ($Q_P/Q_N$) signals.

Figure 4:
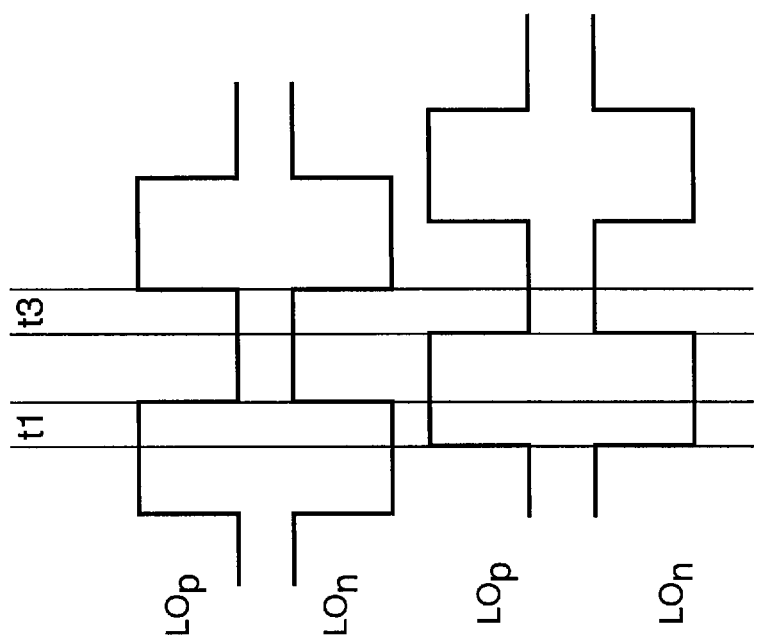
FIG. 4 is a timing diagram of a four-phase pulse clocking scheme used to drive the passive mixer cores of FIG. 3.

The clock circuitry 170 has two functions: generating quadrature pulsed local clock signals and driving the in-phase and quadrature-phase passive mixers 210, 220 with the quadrature pulsed local clock signals. The mixers 210 and 220 are identical in topology, but driven by two different groups of the pulsed clock signals. One group of the clock signals (LO_pulsed 0°/180°) drives the in-phase mixer 210 while the other group of clock signals (LO_pulsed 90°/270°) drives the quadrature-phase mixer 220. The time skew between each clock signal in one group and the corresponding clock signal in the other group is one quarter of the clock period which is the inverse of the local clock frequency. The clock circuitry 170 employs a four-phase clock scheme which forms four even-spaced non-overlapping conducting time slots t1, t2, and t4 for the in-phase and quadrature-phase mixers 210, 220 (time slots t1 and t3 are shown in FIG. 4 as will be described in more detail later). For example, in time slots t1 and t3, the in-phase mixer 210 conducts and samples the input RF signals. The quadrature-phase mixer 220 similarly conducts and samples the input RF signal in time slots t2 and t4. Alternatively, the quadrature-phase mixer 220 can be active during time slots t1 and t3 while the in-phase mixer 210 is active during time slots t2 and t4. For ease of explanation only, operation of only one of the two passive mixers 210, 220 and associated pulsed clocking scheme is discussed in more detail below.

Figure 3:
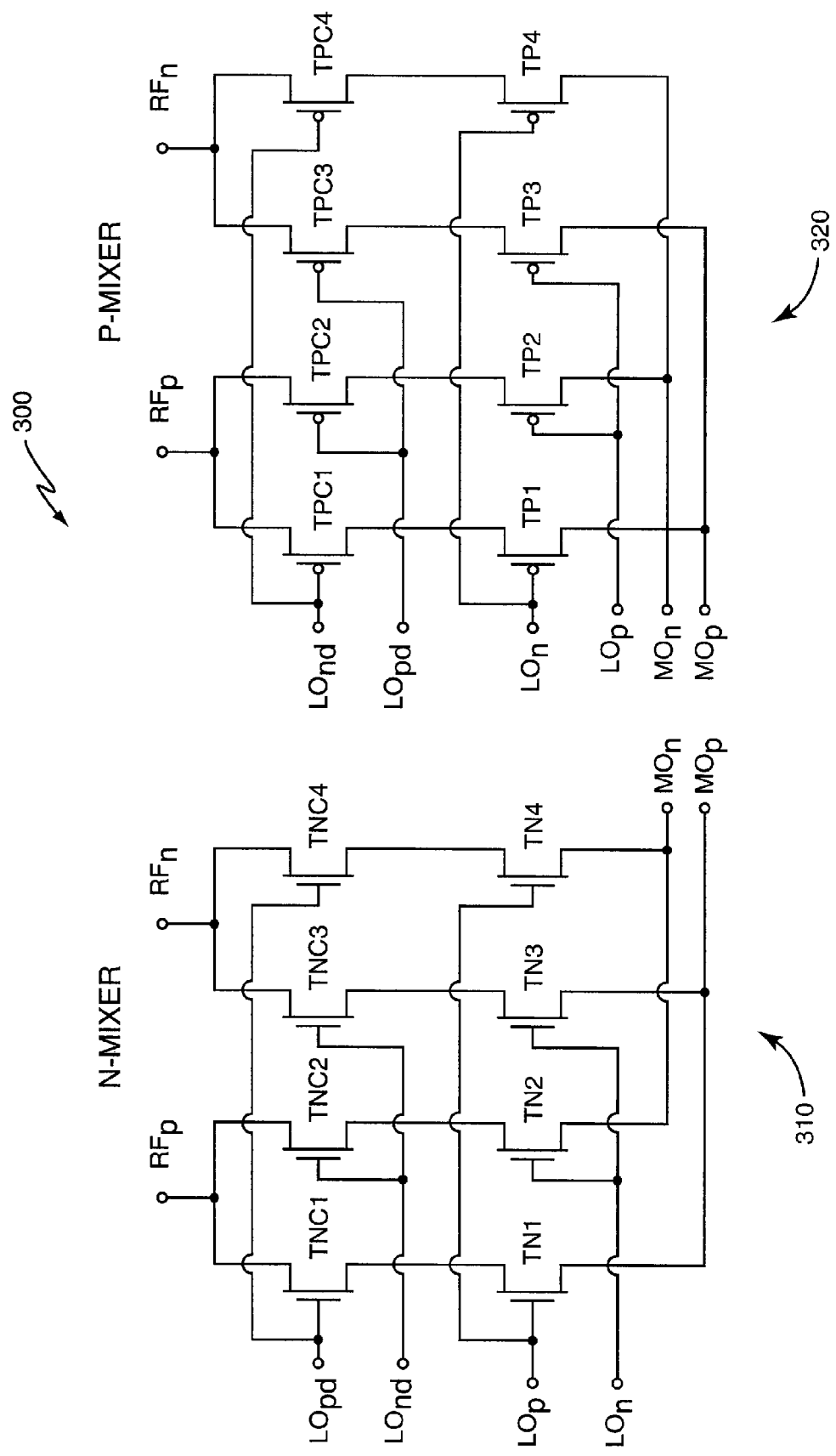
FIG. 3 is a block diagram of an embodiment of passive mixer cores included in the quadrature mixer of FIG. 2.

FIG. 3 illustrates one embodiment of either the in-phase passive mixer 210 or the quadrature-phase passive mixer 220. In some embodiments, the passive mixer 210/220 is an N-mixer having only NMOS transistors. In other embodiments, the passive mixer 210/220 is a P-mixer having only PMOS transistors. In still other embodiments, the passive mixer 210/220 is a complementary passive mixer having both an N-mixer and a P-mixer. According to the embodiment shown in FIG. 3, a complimentary mixer 300 is illustrated. The complimentary mixer 300 includes a passive N-mixer core 310 having NMOS transistors and a passive P-mixer core 320 having PMOS transistors as the switch transistors. The complimentary mixer 300 converts the differential input RF signal (RFp/RFn) to either an in-phase or quadrature-phase differential IF or baseband signals at the mixer outputs (MOn/MOp). As mentioned earlier, for ease of explanation and illustration, only one channel of a quadrature mixer is shown. Those skilled in the art will recognize that the complimentary passive mixer 300 shown in FIG. 3 can be readily replicated and arranged to yield the other channel of the quadrature mixer.

With this understanding, both the N-mixer core 310 and the P-mixer core 320 are driven using the same four-phase pulsed clocking scheme, but with opposite pulse polarity. In more detail, two pulsed LO clock signals (LOp, LOn) and two delayed versions of the pulsed LO clock signals (LOpd, LOnd) are generated by the clock circuitry 170 and used to drive both passive mixer cores 310, 320. The LO clock signals LOp and LOn are differential, and in turn the delayed versions of the LO clock signals LOpd and LOnd are also differential. In this embodiment, all of the pulsed LO clock signals have 50% duty cycle cutting at threshold voltages at gates of the mixer transistors, otherwise imbalance and distortion may occur. FIG. 4 illustrates a timing diagram of the four-phase pulsed clocking scheme used to control the conducting time of the N-mixer and P-mixer cores 310, 320, respectively. Each mixer core 310, 320 has a plurality of mixer input switch transistors connected to a plurality of output switch transistors. The input switch transistors are the transistors having a node connected to the RF input signal while the output switch transistors are the transistors having a node connected to the mixer outputs MOp/MOn. An input switch transistor and the associated output switch transistor in series, form a branch of the mixer core, either of N or P type, depending on the kind of switch transistors used.

In one embodiment, the N-mixer core 310 has four output switch transistors including NMOS transistors TN1, TN2, TN3 and TN4. The P-mixer core 320 similarly has four output switch transistors including PMOS transistors TP1, TP2, TP3 and TP4. Each mixer output switch transistor is connected to a respective input switch transistor. According to the embodiment illustrated in FIG. 3, N-mixer output switch transistors TN1, TN2, TN3 and TN4 are connected to input switch transistors TNC1, TNC2, TNC3 and TNC4, respectively. In the P-mixer 320, the output switch transistors TP1, TP2, TP3 and TP4 are similarly connected to respective PMOS input switch transistors TPC1, TPC2, TPC3 and TPC4.

In one embodiment, the input switch transistors TNC1-TNC4 and TPC1-TPC4 are driven by the delayed quadrature pulsed LO clock signals LOpd and LOnd while the mixer output switch transistors TN1-TN4 and TP1-TP4 are driven by the un-delayed quadrature pulsed LO clock signals LOp and LOn. When LOp and LOpd are both at a high voltage level larger than the threshold voltage of the NMOS transistors, the two branches comprising transistors TN1/TNC1 and TN4/TNC4 conduct simultaneously about a quarter of the clock period during a first conducting time slot t1 as shown in FIG. 4. This portion of the conducting time of the four-phase clock period represents the first time slot (t1) where the input RF signals are sampled by the N-mixer core 310 and the sampling current charges/discharges the mixer capacitive load (not shown). The P-mixer core 320 is driven by the same pulsed LO clock signals LOp, LOn and the same delayed versions of the LO clock signals LOpd, LOnd, but with different branch order so the N-mixer 310 and P-mixer 320 conduct during the same time slots. When LOn and LOnd are both at a logic low voltage level less than the threshold voltage of the PMOS transistors referring to the source voltage, the two branches comprising transistors TP1/TPC1 and TP4/TPC4 conduct simultaneously about a quarter of the clock period during conducting time slot t1 as shown in FIG. 4. This portion of the four-phase clock period represents the first time slot t1 where the P-mixer core 320 drives the mixer load.

Thus, the RF signal RFp/RFn is sampled at time slot t1 by both passive mixer cores 310, 320. The next conducting time slot (t3) is also shown in FIG. 4. During time slot t3, the phase of the RF signal is shifted by 180°. However, the time shift between time slot t1 and t3 is half of the receiving RF signal period. Thus, the sampling polarity is the same and the sampled currents at time slots t1 and t3 are constructively added together at the differential mixer output MOp/MOn in response to the four-phase LO pulsed clocking scheme. Accordingly, the N-mixer 310 conducts during time slot t1 when LOp*LOpd is logic high and the P-mixer 320 conducts when LOn+LOnd is logic low. Similarly, the N-mixer 310 conducts during time slot t3 when LOn*LOnd is logic high and the P-mixer 320 conducts when LOp+LOpd is logic low. Considering the P-mixer 320, the gates of the PMOS transistors TPC1-TPC4 and TP1-TP4 conduct at low voltage, meaning that clock signals LOp, LOn, LOpd and LOpn should be logic low. Thus, the P-mixer 320 functions like negative logic that yields a logic AND operation. Combining both the N-mixer 310 and the P-mixer 320 yields a logic AND operation which is controlled by the LO clock signals applied at the branches of the passive mixers 310, 320.

In yet another embodiment, the clock signals applied to the branches of the complimentary mixer 300 can be swapped without changing the mixer function. That is, the output switch transistors TN1-TN4 and TP1-TP4 can be driven by the delayed quadrature LO clock signals LOpd and LOnd while the mixer input switch transistors TNC1-TNC4 and TPC1-TPC4 can be driven by the un-delayed quadrature LO clock signals LOp and LOn.

Figure 5:
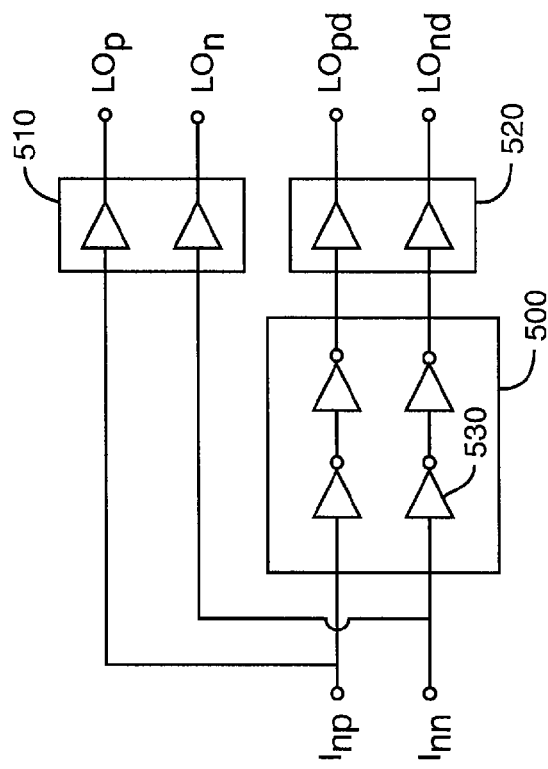
FIG. 5 is a block diagram of an embodiment of clock driver circuitry for controlling operation of the quadrature mixer of FIG. 2.

FIG. 5 illustrates one embodiment of the clock circuitry 170 for generating the pulsed LO clock signals LOp, LOn, LOpd and LOnd. According to this embodiment, the clock circuitry 170 includes a delay stage 500 and symmetric driver output stages 510, 520. A differential pulsed LO clock signal (Inp, Inn) is input to the clock circuitry 170. The differential clock signals are fed directly to the first symmetric driver output stage 510, producing LOp and LOn. The pulsed differential LO clock signals are also delayed by the delay stage 500. According to this embodiment, the delay stage 500 has an even number of inverting delay buffers 530, and the delay time should be a quarter of one clock period to keep equal sample space inside one clock period. The delayed differential clock signals are then fed to the second symmetric driver output stage 520, producing the delayed versions of the LO clock signals, LOpd and LOnd.

Figure 6:
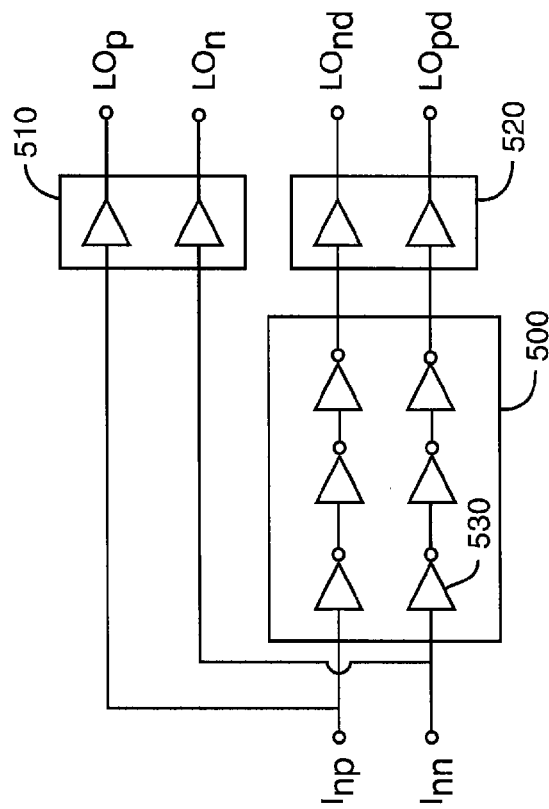
FIG. 6 is a block diagram of another embodiment of clock driver circuitry for controlling operation of the quadrature mixer of FIG. 2.

FIG. 6 illustrates another embodiment of the clock circuitry 170. According to this embodiment, the delay stage 500 of the clock circuitry 170 has an odd number of inverting delay buffers 530. In either embodiment, the pulsed LO clock signals have a duty cycle of 50% because both mixer cores 310, 320 share the same clock signals. A 50% duty cycle can be maintained by AC-coupling the LO clock signals to the mixer cores 310, 320, and biasing the mixer core 310, 320 with appropriate bias voltages as described later. AC-coupling the LO clock signals to the mixer cores 310, 320 further reduces clock duty cycle asymmetry, reducing imbalances between the mixer cores 310, 320 of the complimentary mixer 300. In the case that an even number of inverting delay buffers 530 are used, the delay time is td=0.5 Tp−Tc, where td is required delay time, Tp is clock period, and Tc is the conducting time of the four-phase pulsed clocks. In the case that an odd number of inverting delay buffer 530 is used, the delay time is approximately td=Tc.

Figure 7:
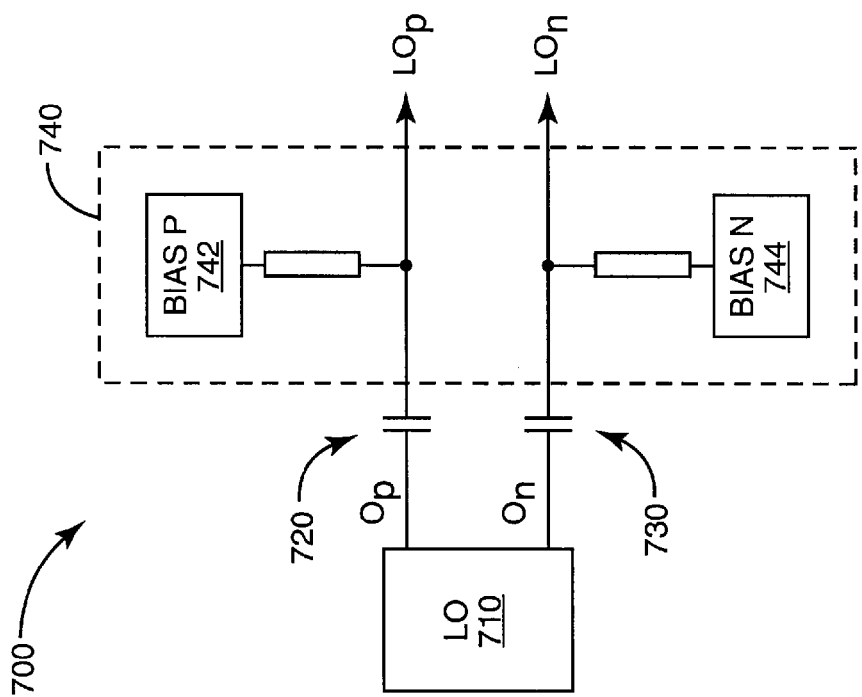
FIG. 7 is a block diagram of an embodiment of a direct AC clock coupling network.

FIG. 7 illustrates one embodiment of an AC coupling network 700 that couples the LO clock signals LOp and LOn to the N-mixer and P-mixer cores 310, 320. The LO component 710 of the clock circuitry 170 generates differential pulsed LO clock signals Op and On. The differential LO clock signals Op and On are directly AC-coupled to the N-mixer and P-mixer cores 310, 320 via respective capacitors 720, 730. Coupling Op and On to the N-mixer and P-mixer cores 310, 320 using the AC coupling network 700 reduces leakage between the mixer cores 310, 320.

The AC coupling network 700 may also include bias circuitry 740 for improving matching between the pulsed LO clock signals LOp and LOn. A bias circuit 742, 744 is coupled to respective ones of the capacitor outputs. The bias circuits 742, 744 adjust the bias levels of the respective LO clock signals LOp and LOn, improving matching between the signals. This in turn advantageously adjusts the conducting time slots (t1 and t3) of the N-mixer and P-mixer cores 310, 320. In one embodiment, the bias circuits 742, 744 are digital-to-analog converters (DAC) that output a bias voltage applied to respective ones of the pulsed LO clock signals LOp and LOn. In another embodiment, the bias circuits 742, 744 are current mirrors that generate the respective bias voltages. Still other types of bias circuitry may be used. When the bias voltages are properly set, the conducting angle of the N-mixer and P-mixer cores 310, 320 can be controlled to maintain balance between the mixer cores 310, 320. Moreover, AC coupling the LO clock signals to the mixer cores 310, 320 improves overdrive between the gate and source of the switch transistors, further reducing mixer non-linearity.

Figure 8:
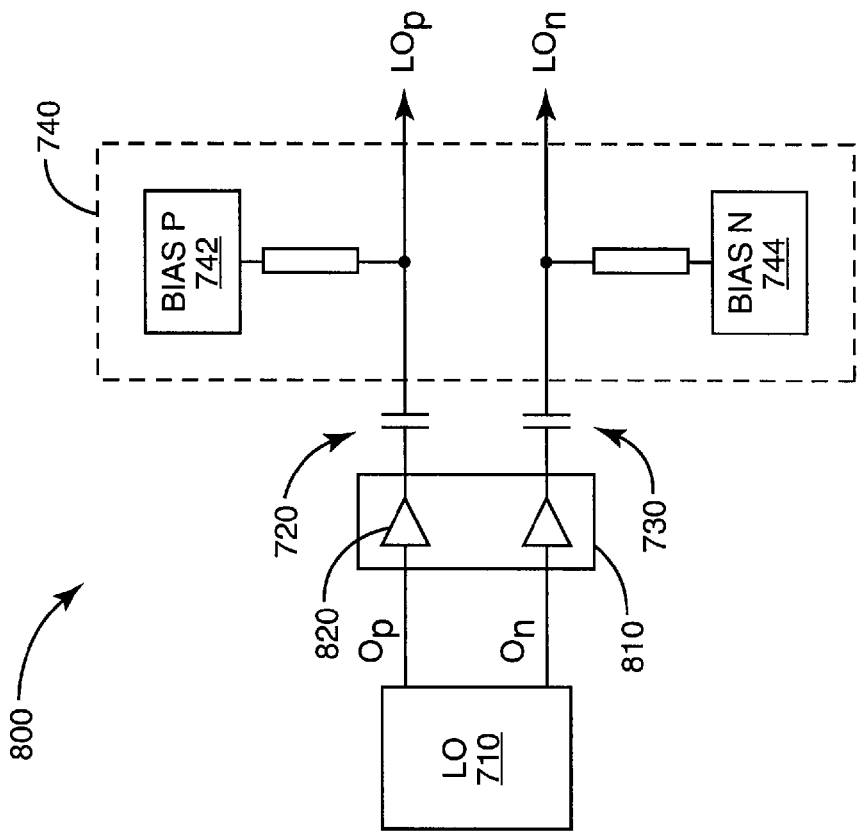
FIG. 8 is a block diagram of an embodiment of an AC clock coupling network including a buffer circuit.

FIG. 8 illustrates another embodiment of an AC coupling network 800. According to this embodiment, the pulsed LO outputs Op and On are input to a clock buffer 810. The clock buffer 810 outputs are then AC coupled to the N-mixer and P-mixer cores 310, 320 via the respective capacitors 720, 730. In one embodiment, the clock buffer 810 includes a buffer element 820 inserted between each LO differential output and the corresponding AC coupling capacitor. The insertion of the buffer element 820 can isolate a VCO (not shown) from the complimentary mixer 300, reducing self-mixing which is problematic for the receiver 120.

Figure 9:
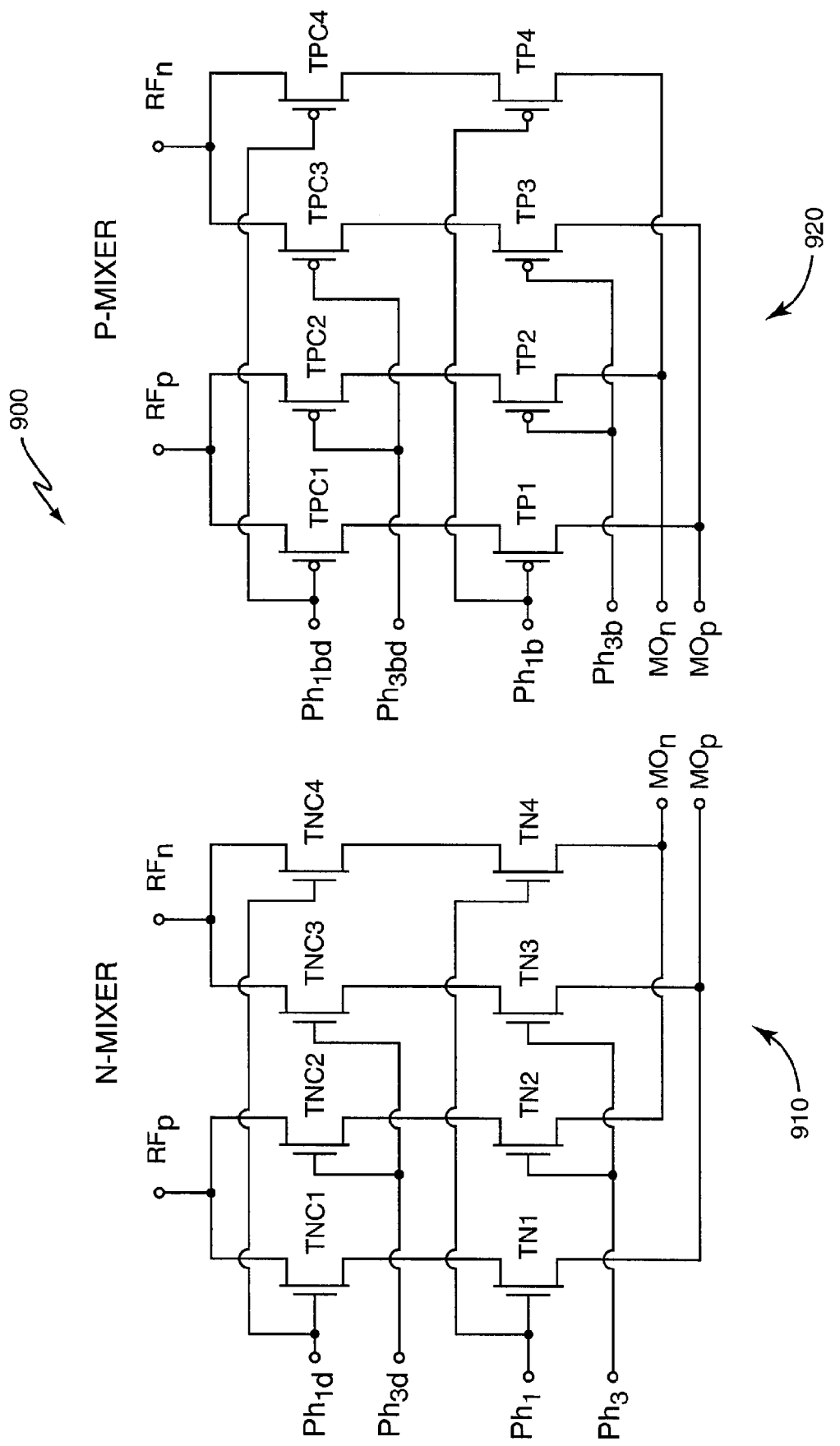
FIG. 9 is a block diagram of another embodiment of passive mixer cores included in the quadrature mixer of FIG. 2.

FIG. 9 illustrates another embodiment of the passive in-phase mixer 210 or quadrature-phase mixer 220 included in the receiver 120. The topology of this embodiment is identical to that shown in FIG. 3, but the clock connections are different. According to this embodiment, a complimentary passive mixer 900 includes an N-mixer core 910 having NMOS transistors and a P-mixer core 920 having PMOS transistors as the switch transistors. The N-mixer core 910 or the P-mixer core 920 alone can form either the in-phase or quadrature-phase mixer of a quadrature mixer.

Both mixer cores 910, 920 have a plurality of mixer branches, each mixer branch including an input switch transistor connected to an output switch transistor. In one embodiment, the N-mixer core 910 has four output switch transistors including NMOS transistors TN1, TN2, TN3 and TN4. The P-mixer core 920 similarly has four output switch transistors including PMOS transistors TP1, TP2, TP3 and TP4. According to the embodiment illustrated in FIG. 9, the N-mixer output switch transistors TN1, TN2,TN3 and TN4 are connected to NMOS input switch transistor TNC1, TNC2, TNC3 and TNC4, respectively. The P-mixer output switch transistors TP1, TP2, TP3 and TP4 are similarly connected to respective PMOS input switch transistors TPC1, TPC2, TPC3 and TPC4.

Figure 10:
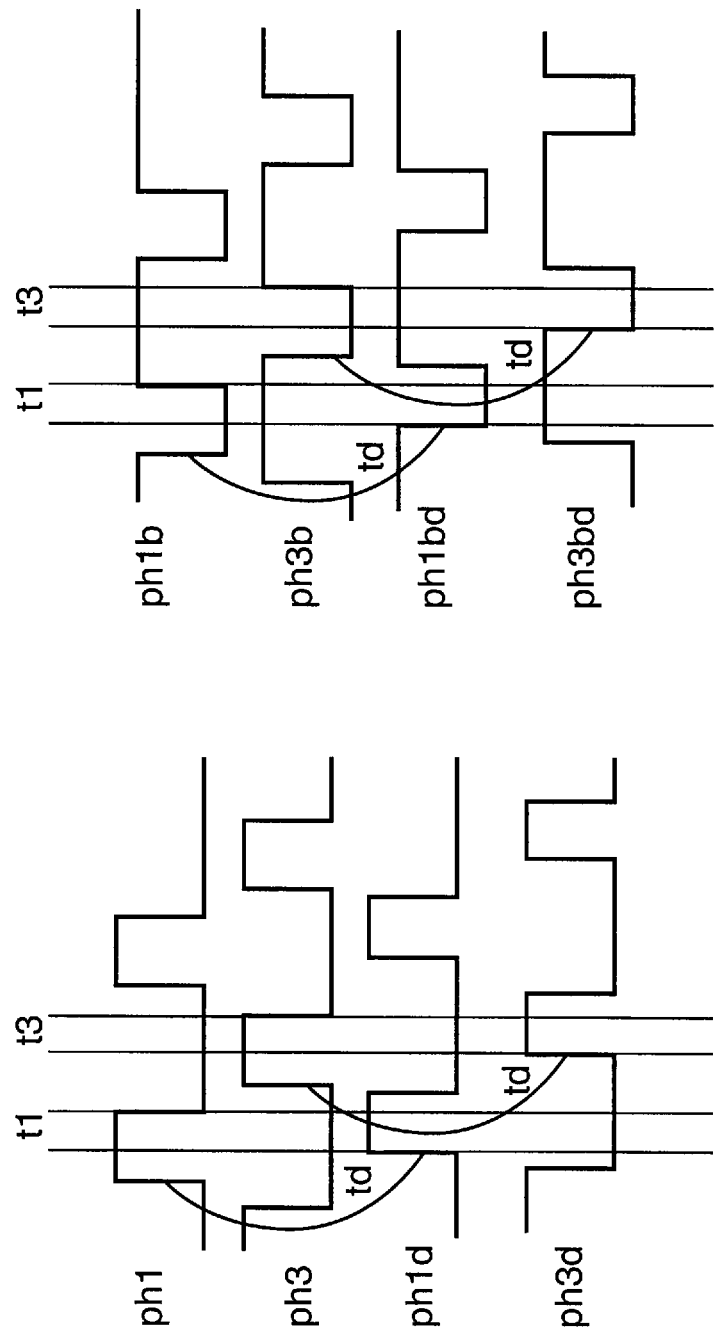
FIG. 10 is a timing diagram of a four-phase clocking scheme used to drive the passive mixer cores of FIG. 9.

The N-mixer and P-mixer cores 910, 920 are driven using eight pulsed clock signals instead of sharing four-phase pulsed clock signals. In more detail, each passive mixer core 910, 920 is driven by a different group of four-phase pulsed clock signals. The four-phase pulsed clock signals used to drive the N-mixer core 910 are of the opposite polarity as those used to drive the P-mixer core 920 as shown in FIG. 10. In other words, clock signals Ph1, Ph3, Ph1d and Ph3d which drive the N-mixer 910 are complementary to clock signals Ph1b, Ph3b, Ph1bd and Ph3bd which drive the P-mixer 920. In the embodiment illustrated in FIG. 9, the LO pulsed clock signals need not have a 50% duty cycle to reduce leakage between the mixer cores 910, 920 because each mixer core 910, 920 is driven separately.

Particularly, two of the pulsed LO clock signals (Ph1 and Ph3) and delayed versions of the two LO clock signals (Ph1d and Ph3d) are generated by the LO component 710 of the clock circuitry 170 or the clock buffer 810 of FIGS. 7-8. The pulsed LO clock signals Ph1 and Ph3 and the delayed versions of the LO clock signals Ph1d and Ph3d are applied to the N-mixer core 910, causing the N-mixer core 910 to have conducting time slots as shown in FIG. 10. Only two branches of the N-mixer core 910 conduct during each time slot. For example, when both clocks Ph1 and Ph1d are at logic high level during time slot t1, the branches comprising TN1/TNC1 and TN4/TNC4 are conducting.

Operation of the P-mixer core 920 is similarly controlled by two different pulsed LO clock signals (Ph1b and Ph3b) and delayed versions of the LO clock signals (Ph1bd and Ph3bd) also as shown in FIG. 10, where an even number of inverting delay buffers 530 are used to generate the clock signals. For example, when both clocks Ph1b and Ph1bd are at logic low level during time slot t1, the branches comprising TP1/TPC1 and TP4/TPC4 are conducting. Another conducting slot t3 for both mixer cores 910, 920 occurs a half clock period later during the clock period when both Ph3 and Ph3d are at logic high for the N-mixer 910 and both of the complementary clock signals Ph3b and Ph3bd are at logic low for the P-mixer 920. Each conducting time slot has a duration of Tw-td, where Tw is the pulse width of the corresponding LO clock signal and td is the delay time.

Figure 11:
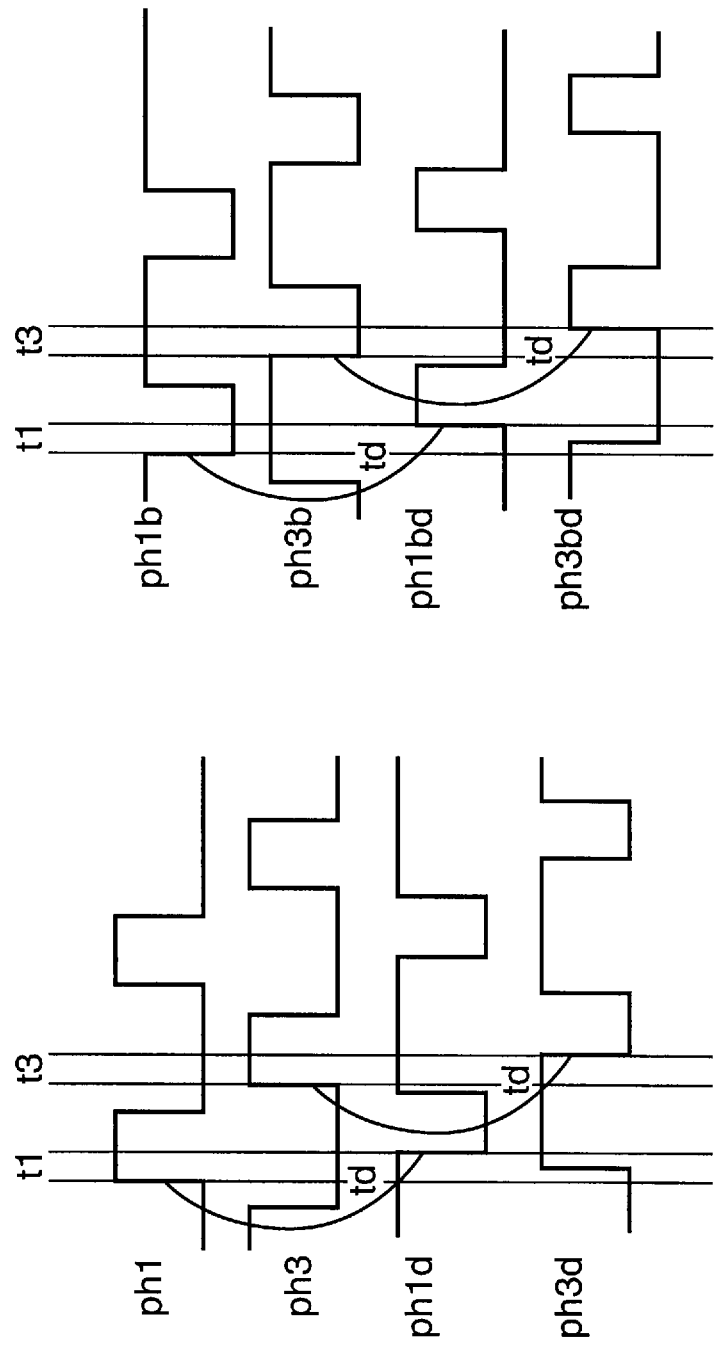
FIG. 11 is a timing diagram of another four-phase clocking scheme used to drive the passive mixer cores of FIG. 9.

FIG. 11 illustrates another embodiment where the pulsed LO clock signals Ph1, Ph3, Ph1d, Ph3d, Ph1b, Ph3b, Ph1bd and Ph3bd are generated by an odd stage delay buffer such as the one shown in FIG. 6. Accordingly, the conducting time slots t1 and t3 occur during the beginning part of the LO clock pulses as shown in FIG. 11. In either clocking embodiment of FIGS. 10 and 11, the separate four-phase pulsed clocking schemes relax the duty cycle constraints placed on the clock circuitry 170 as described above because each passive mixer 910, 920 is independently controlled by a different group of pulsed clock signals.

Similar to the embodiment shown in FIG. 3, the clock signals at all branches of the complimentary passive mixer 900 can be swapped. That is, the output switch transistors TN1-TN4 and TP1-TP4 can be driven by the delayed quadrature LO pulsed clock signals Ph1d, Ph3d, Ph1bd and Ph3bd while the mixer input switch transistors TNC1-TNC4 and TPC1-TPC4 can be driven by the un-delayed quadrature LO pulsed clock signals Ph1, Ph3, Ph1b and Ph3b.

With regard to the embodiment shown in FIG. 3, four pulsed LO clock signals LOp, LOn, LOpd and LOnd are used to control operation of both passive mixers 310, 320. However, clock signals LOp, LOn, LOpd and LOnd preferably have a duty cycle of 50% to efficiently drive the quadrature mixers 210, 220. In other words, if there are quadrature-phase LO clocks with time skew of 0, 0.25 Tp, 0.5 Tp and 0.75 Tp or initial phase of 0, 90, 180 and 270 degree, then the four-phase clock scheme can be implemented with conducting time of a quarter clock period.

With regard to the embodiment shown in FIG. 9, the differential quadrature-phase LO clock signals are used as original pulsed clock inputs. Particularly, the eight delayed differential quadrature-phase LO clock signals Ph1, Ph3, Ph1d, Ph3d, Ph1b, Ph3b, Ph1bd and Ph3bd can be readily created based on the original clock inputs. This way, the 50% duty cycle constraint associated with the embodiment of FIG. 3 can be relaxed for the pulsed clock signals used in the embodiment of FIG. 9, relaxing clock circuitry design constraints.

With the above range of variations and applications in mind, it should be understood that the present invention is not limited by the foregoing description, nor is it limited by the accompanying drawings. Instead, the present invention is limited only by the following claims, and their legal equivalents.

What is claimed is:

1. A radio frequency receiver, comprising:
    a quadrature mixer configured to convert radio frequency signals to baseband signals or intermediate frequency signals, the quadrature mixer comprising an in-phase passive mixer and a quadrature-phase passive mixer, wherein each of the passive mixers comprises:
        a mixer core having a plurality of mixer input switch transistors; and
        a plurality of output switch transistors connected to the mixer input switch transistors;
    clock circuitry configured to generate a plurality of quadrature pulsed clock signals and delayed versions of the quadrature pulsed clock signals;
    one or more capacitors arranged to capacitively couple at least one of the quadrature pulsed clock signals and the delayed versions of the quadrature pulsed clock signals to the passive mixers; and
    bias circuitry configured to adjust a conducting time slot of the passive mixers;
    wherein the quadrature pulsed clock signals and the delayed versions of the quadrature pulsed clock signals are arranged to drive the mixer input switch transistors and the output switch transistors.

2. The radio frequency receiver of claim 1, wherein the clock circuitry is configured to generate four quadrature pulsed clock signals.

3. The radio frequency receiver of claim 2, wherein the four quadrature pulsed clock signals and their delayed versions have a duty cycle of approximately 50%.

4. The radio frequency receiver of claim 1, wherein each of the passive mixers comprises an N-mixer having NMOS transistors, a P-mixer having PMOS transistors or a complementary mixer having an N-mixer and a P-mixer.

5. The radio frequency receiver of claim 1, wherein the clock circuitry is configured to generate four pairs of differential quadrature pulsed clock signals having a duty cycle of less than 50%.

6. The radio frequency receiver of claim 1, further comprising clock buffer circuitry configured to buffer the quadrature pulsed clock signals clock signals and/or the delayed versions of the quadrature pulsed clock signals before the clock signals are capacitively coupled to the passive mixers.

7. The radio frequency receiver of claim 1, wherein the clock circuitry comprises delay circuitry having a plurality of delay buffer stages.

8. The radio frequency receiver of claim 7, wherein the delay circuitry comprises an odd or even number of delay buffer stages.

9. The radio frequency receiver of claim 1, wherein the quadrature pulsed clock signals are arranged to drive the mixer input switch transistors and the delayed versions of the quadrature pulsed clock signals are arranged to drive the output switch transistors.

10. The radio frequency receiver of claim 1, wherein the quadrature pulsed clock signals are arranged to drive the output switch transistors and the delayed versions of the quadrature pulsed clock signals are arranged to drive the mixer input switch transistors.

11. A method of converting radio frequency signals to baseband signals or intermediate frequency signals, comprising:
    providing an in-phase passive mixer and a quadrature-phase passive mixer, wherein each of the passive mixers comprises a mixer core having a plurality of mixer input switch transistors and a plurality of output switch transistors connected to the mixer input switch transistors;
    generating a plurality of quadrature pulsed clock signals and delayed versions of the quadrature pulsed clock signals;
    driving the mixer input switch transistors and the output switch transistors with the quadrature pulsed clock signals and the delayed versions of the quadrature pulsed clock signals;
    capacitively coupling at least one of the quadrature pulsed clock signals and the delayed versions of the quadrature pulsed clock signals to the passive mixers; and
    adjusting a conducting time slot of the passive mixers.

12. The method of claim 11, wherein generating a plurality of quadrature pulsed clock signals comprises generating four quadrature pulsed clock signals.

13. The method of claim 12, further comprising setting the duty cycle of the four quadrature pulsed clock signals and their delayed versions to approximately 50%.

14. The method of claim 11, wherein generating a plurality of quadrature pulsed clock signals comprises generating four pairs of differential quadrature pulsed clock signals having a duty cycle of less than 50%.

15. The method of claim 11, wherein generating a plurality of quadrature pulsed clock signals and delayed versions of the quadrature pulsed clock signals comprises:
    obtaining the quadrature pulsed clock signals from a differential pulsed clock signal; and
    delaying the differential pulsed clock signal via a plurality of delay buffer stages to obtain the delayed versions of the quadrature pulsed clock signals.

16. The method of claim 11, further comprising buffering the quadrature pulsed clock signals clock signals and/or the delayed versions of the quadrature pulsed clock signals before the clock signals are capacitively coupled to the passive mixers.

17. The method of claim 11, wherein driving the mixer input switch transistors and the output switch transistors with the quadrature pulsed clock signals and the delayed versions of the quadrature pulsed clock signals comprises:
    driving the mixer input switch transistors with the quadrature pulsed clock signals; and
    driving the output switch transistors with the delayed versions of the quadrature pulsed clock signals.

18. The method of claim 11, wherein driving the mixer input switch transistors and the output switch transistors with the quadrature pulsed clock signals and the delayed versions of the quadrature pulsed clock signals comprises:
    driving the output switch transistors with the quadrature pulsed clock signals; and driving the mixer input switch transistors with the delayed versions of the quadrature pulsed clock signals.

* * * * *

UNITED STATES PATENT AND TRADEMARK OFFICE
CERTIFICATE OF CORRECTION

PATENT NO. : 8,433,277 B2  Page 1 of 1
APPLICATION NO. : 12/108252
DATED : April 30, 2013
INVENTOR(S) : Fenghao et al.

It is certified that error appears in the above-identified patent and that said Letters Patent is hereby corrected as shown below:

In the Specification

In Column 4, Line 6, delete "then" and insert -- than --, therefor.

In Column 4, Line 9, delete "then" and insert -- than --, therefor.

In Column 4, Line 40, delete "t2," and insert -- t2, t3 --, therefor.

In the Claims

In Column 9, Line 57, in Claim 6, delete "clock signals clock signals" and insert -- clock signals --, therefor.

In Column 10, Line 49, in Claim 16, delete "clock signals clock signals" and insert -- clock signals --, therefor.

Signed and Sealed this
Twenty-second Day of October, 2013

Teresa Stanek Rea
*Deputy Director of the United States Patent and Trademark Office*